(12) United States Patent
Kanetani et al.

(10) Patent No.: US 6,333,645 B1
(45) Date of Patent: Dec. 25, 2001

(54) CLOCKED LOGIC GATE CIRCUIT

(75) Inventors: Kazuo Kanetani, Akishima; Hiroaki Nambu, Sagamihara; Kaname Yamasaki, Kodaira; Noboru Masuda, Tokorozawa; Kenji Kaneko, Sagamihara; Makoto Hanawa, Niiza; Takeshi Kusunoki, Tachikawa, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/659,541

(22) Filed: Sep. 11, 2000

Related U.S. Application Data

(62) Division of application No. 08/934,781, filed on Sep. 22, 1997, now abandoned.

(30) Foreign Application Priority Data

Sep. 20, 1996 (JP) .................................................... 8-249587

(51) Int. Cl.[7] ................................................ H03K 19/096

(52) U.S. Cl. ................................ 326/98; 326/95; 326/115

(58) Field of Search ................................ 326/95, 98, 112, 326/119, 121, 115

(56) References Cited

U.S. PATENT DOCUMENTS 5,291,076 * 3/1994 Bridges et al. ...................... 307/449
5,373,203 12/1994 Nicholes et al. .

FOREIGN PATENT DOCUMENTS 8-307243 11/1996 (JP) .

OTHER PUBLICATIONS

Weste et al., "Principle of CMOS VLSI Design: A Systems Perspective", 1988, pp. 144–145.

* cited by examiner

*Primary Examiner*—Michael Tokar
*Assistant Examiner*—Anh Q. Tran
(74) *Attorney, Agent, or Firm*—Antonelli, Terry, Stout & Kraus, LLP

(57) ABSTRACT

A clocked logic gate circuit is constituted so that a switch unit is constituted by a logic block and a reference MOS transistor, the source of the reference MOS transistor is connected to one output of the logic block, the gate of the reference MOS transistor is connected to the other output of the logic block, and MOS transistors (input transistors) constituting the logic block are connected in parallel. With this arrangement, complementary inputs are not required and a driving MOS transistor and an input transistor (or a driving MOS transistor and a reference MOS transistor) can be connected in series. As a result, a circuit is obtained which is simpler than the double rail logic in constitution is facilitated and can be operated at a higher speed than a CMOS logic circuit and a path transistor logic circuit.

8 Claims, 11 Drawing Sheets

| ITEMS | STATE | | CLK Φ | INPUT | | NOR OUTPUT Q̄ | OR OUTPUT Q | |
|---|---|---|---|---|---|---|---|---|
| | | | | INm | IN1 | | | |
| 1 | PRECHARGE | | L | — | — | H | H | NON-SELECTED |
| 2 | EVALUATION | CASE 1 | H | L | L | H | L | SELECTED |
| 3 | | | H | L | H | L | H | NON-SELECTED |
| 4 | | CASE 2 | H | H | L | L | H | |
| 5 | | | H | H | H | L | H | |

| ITEMS | STATE | | CLK Φ | INPUT | | AND OUTPUT Q | NAND OUTPUT $\overline{Q}$ | |
|---|---|---|---|---|---|---|---|---|
| | | | | INm | IN1 | | | |
| 1 | PRECHARGE | | L | — | — | H | H | NON-SELECTED |
| 2 | EVALUATION | CASE 1 | H | L | L | L | H | NON-SELECTED |
| 3 | | | H | L | H | L | H | |
| 4 | | | H | H | L | L | H | |
| 5 | | CASE 2 | H | H | H | H | L | SELECTED |

| ITEMS | STATE | | CLK Φ | INPUT | | NAND OUTPUT $\overline{Q}$ | AND OUTPUT Q | |
|---|---|---|---|---|---|---|---|---|
| | | | | INm | IN1 | | | |
| 1 | PRECHARGE | | H | — | — | L | L | NON-SELECTED |
| 2 | EVALUATION | CASE 1 | L | L | L | H | L | NON-SELECTED |
| 3 | | CASE 2 | L | L | H | H | L | |
| 4 | | | L | H | L | H | L | |
| 5 | | | L | H | H | L | H | SELECTED |

FIG. 20

| | | Speed-up factors | | | |
|---|---|---|---|---|---|
| | | Number of NMOS transistors connected in series | Input capacitor | Output polarity | Necessity of complimental inputs |
| Prior Art | FIG. 19A STATIC CMOS | Number of inputs ✗ | PMOS NMOS ✗ | UNIPOLAR ✗ | NO ○ |
| | FIG. 19B DYNAMIC CMOS (INCLUDING DOMINO) | Number of inputs +1 ✗ | ONLY NMOS ○ | UNIPOLAR ✗ | NO ○ |
| | FIG. 19C DYNAMIC CVSL | Number of inputs +1 ✗ | ONLY NMOS ○ | BIPOLAR ○ | YES ✗ |
| FIG. 19D | SCL | 2 ○ | ONLY NMOS ○ | BIPOLAR ○ | NO ○ |

CLOCKED LOGIC GATE CIRCUIT

CROSS-REFERENCE TO RELATED APPLICATION

This application is a divisional of application Ser. No. 08/934,781, filed on Sep. 22, 1997 now abandoned, the entire closure of which is hereby incorporated by reference.

BACKGROUND OF THE INVENTION

The present invention relates to a clocked logic gate circuit in which speedup and facility are realized.

For a prior example of a logic gate circuit, a clocked cascade voltage switch logic circuit (CVSL) (hereinafter called clocked CVSL) is known which is described at pages 144 and 145 of "Principle of CMOS VLSI Design: A Systems Perspective" supervised and translated by Tomisawa and Matsuyama and published by Maruzen Co., Ltd. (1988), which is translation of the original publication of the same title by Neil H. E. Weste & Karman Eshraghian. FIG. 3 shows the above circuit.

The above clocked CVSL is the same as two domino gates operated by true inputs and their complementary inputs with a minimized logic tree. This type logic is superior to a domino logic in that merely a logic with an arbitrary logical expression can be generated and a complete logic family can be constituted. The above logic is superior to a complementary metal-oxide semiconductor (CMOS) logic circuit and a path transistor logic circuit in terms of high speed.

SUMMARY OF THE INVENTION

However, such priority is realized at the cost of excessive wirings, and an effective area which result from its operating with pairs of mutually complementary inputs and at the cost of complexity accompanying a double rail logic.

The object of the present invention is to provide a logic gate circuit which is simpler and easier to use than a double rail logic, and operates at a higher speed than a CMOS logic circuit and a path transistor logic circuit.

The above object is achieved by a circuit which comprises a first load unit (Z2) which is provided between the first electric potential and the first node, and charges the first node to the second electric potential, in response to a signal (N); the second load unit (Z1) which is provided between the first electric potential and the second node, and charges the second node to the third electric potential, in response to the above signal; a switch circuit (SW) provided among the first node, the second node and the third node; and a drive circuit (DV) which is provided between the above third node and the fourth electric potential, and drives the above switch circuit, in response to the above signal, wherein the above switch circuit comprises a logic circuit (NB) which is provided between the above first node and the above third node, and electrically connects the first node and the third node, in response to an input signal; and a reference field effect transistor (FET) (QNB) which has its source-drain path formed between the above second node and the above third node, and its gate connected to the above first node.

BRIEF DESCRIPTION OF THE DRAWINGS

FIG. 20 is a comparison drawing of the logic circuits shown in FIGS. 19A, 19B, 19C and 19D.

DESCRIPTION OF THE PREFERRED EMBODIMENTS

Figures 1, 2:
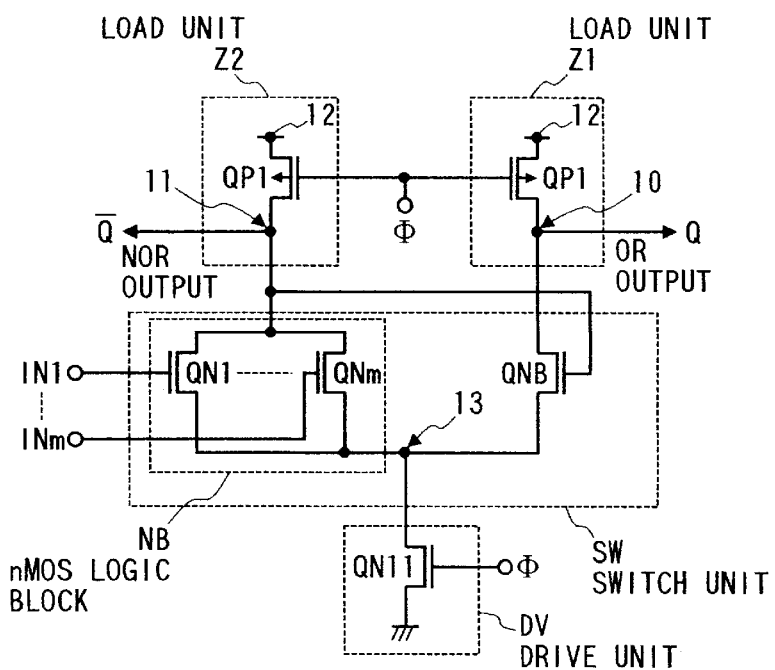
FIG. 1 shows the first embodiment of the present invention.
FIG. 2 shows a truth table in the first embodiment of the present invention.

FIG. 1 shows the first embodiment of the present invention. Broken lines in FIG. 1 are ones for showing a block and are not signal lines. An nMOS logic block NB is constituted by plural nMOS transistors QN1 to QNm connected in parallel which respectively receive plural input signals IN1 to INm at the respective gates. Parallel connection is realized by connecting the sources of the nMOS transistors QN1 to QNm with each other and the drains thereof with each other. The side of output to which all sources are connected is called a source side output and the side of output to which all drains are connected is called a drain-side output. The source side output and the source of the reference nMOS transistor QNB are mutually connected by source-coupling and constitutes a switch unit SW. The drain of a driving nMOS transistor QN11 in a drive unit DV is connected to the above source-coupled part of the above switch SW at a node 13. The drain of a precharging pMOS transistor QP1 of the load unit Z1 is connected to the drain of the above reference nMOS transistor QNB at a node 10, while the drain of the precharging pMOS transistor QP1 of the load unit Z2 is connected to the drain side output of the nMOS logic block NB at a node 11. Also, each source of the respective precharging pMOS transistors QP1 of the load unit Z1 and Z2 is connected to the source voltage 12. The gate of the precharging pMOS transistor QP1 of each load unit Z1 or Z2 and the gate of the driving nMOS transistor QN11 in the driving unit DV are both driven by a signal (for example, a clock signal) φ. The drain side output Q of the reference nMOS transistor QNB and the drain side output $\overline{Q}$ of the nMOS logic block NB are the outputs of the clocked logic gate circuit, the output Q is an OR output, and the output $\overline{Q}$ is a NOR output. Further, the gate of the reference nMOS transistor QNB is connected to the drain of the precharging pMOS transistor QP1 of the load unit Z2. The circuits of the present embodiment is realized as a large scale integration circuit on a semiconductor chip. The same is true with all the subsequent embodiments.

Next, referring to a circuit diagram shown in FIG. 1 and a truth table shown in FIG. 2, the operation of a circuit will be described. As shown in FIG. 2, the time phase in which the clock signal φ is at low potential (hereinafter called as the L level) is a precharge phase in which the nodes 10 and 11 are charged by a power source 12. In this phase the NOR output and the OR output have a fixed value independent of the respective values of input signals IN1 to INm. The time phase in which the clock signal is at high potential (hereinafter called as the H level) is an evaluate phase in which the respective values of the NOR output and OR output are respectively determined depending upon the values of the input signals IN1 to INm. The case 1 is a case where all input signals IN1 to INm are at the L level in the evaluate phase, and the case 2 is a case where one or more of input signals IN1 to INm are at the H level in the evaluate phase.

First, in the precharge phase, where the clock signal φ is at the L level, the precharging pMOS transistor QP1 of each of the loads unit Z1 and Z2 becomes conductive and the outputs parts (the nodes 10 and 11) are charged to the H level, OR output Q and NOR output $\overline{Q}$ are both at the H level. That is, both outputs are at the H level independent of the state of input signals IN1 to INm. Next, the case (case 1) in which the level of the clock signal φ has proceeded from the L level to the H level and the clock signal has proceeded to an evaluate phase will be described. At this time, in case all input signals IN1 to INm are at the L level, input transistors QN1 to QNm are not conductive. Therefore, the node 11 is still at the H level and, as a result, the gate of the reference nMOS transistor QNB is at the H level and the reference nMOS transistor QNB becomes conductive, as the OR output Q is discharged to the L level, and the NOR output $\overline{Q}$ is not discharged and is kept at the H level. In a case (case 2) where one or more of input signals IN1 to INm are at the H level, OR output Q is at the H level and NOR output $\overline{Q}$ is at the L level. For example, if the input signal IN1 is at the H level, the input transistor QN1 and the reference nMOS transistor QNB become conductive, at first. Because the input transistor QN1 is conductive, the NOR output $\overline{Q}$, that is, the gate potential of the reference nMOS transistor QNB is discharged and reaches the L level rapidly. Therefore, the reference nMOS transistor QNB rapidly becomes non-conductive and OR output Q is not discharged and held at the H level.

If the circuit is used for a decoder circuit, OR output Q is selected as the output of the decoder circuit. The case (case 1) in which all input signals IN1 to INm are at the L level and OR output Q is at the L level is used as a selected state. When OR output is supplied from the circuit, it means a circuit not shown which receives the signal is selected. In the meantime, the case (case 2) in which one or more of input signals IN1 to INm are at the H level and OR output Q is at the H level is used as an unselected state. In this case, it means that the circuit not shown which receives the OR output is not selected.

As described above, as a signal line for inputting the drain side output of the nMOS logic block NB to the gate of the reference nMOS transistor is provided, this embodiment does not require complementary inputs, is free from complexity accompanying the double rail logic, and is easy to manipulate. As the number of nMOS transistors connected in series is two of the driving nMOS transistor QN11 and the input transistors (or two of the driving nMOS transistor QN11 and the reference nMOS transistor QNB), independent of the number of the inputs, the above clocked logic gate circuit is basically higher in sped than, for example a CMOS logic circuit and a path transistor logic circuit wherein the number of transistors connected in series becomes two or more, if the number of inputs is two or more.

Seen from a different angle, it can be said that the clocked logic gate circuit in this embodiment is a clocked circuit wherein the number of nMOS transistors connected in series is two in a switch unit (two of the driving nMOS transistor QN11 and the input transistor or two of the driving nMOS transistor QN11 and the reference nMOS transistor QNB), independent of the number of input signals to the logic circuit, both polarities can be obtained for the polarity of an output signal, and at this time, complementary inputs are not required for the inputs to the logic circuit.

Figure 4A:
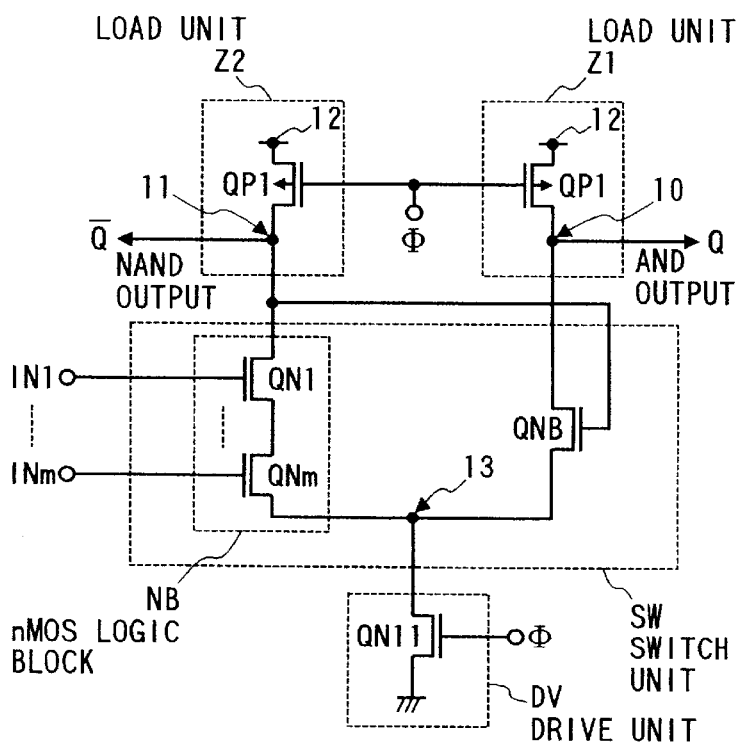
FIG. 4A shows the second embodiment of the present invention.

Next, the second embodiment shown in FIG. 4A will be described. This embodiment is different from the first embodiment shown in FIG. 1 in terms of the nMOS logic block NB. An nMOS logic block NB in this embodiment is constituted by one or plural nMOS transistors connected in series QN1 to QNm which receives one or plural input signals IN1 to INm at their gates. Connection in series means a state in which the drain of each of the nMOS transistors QN1 to QNm is connected with the source of the next transistor. In this embodiment, output Q is an AND output and output $\overline{Q}$ is a NAND output).

Figures 5, 6:
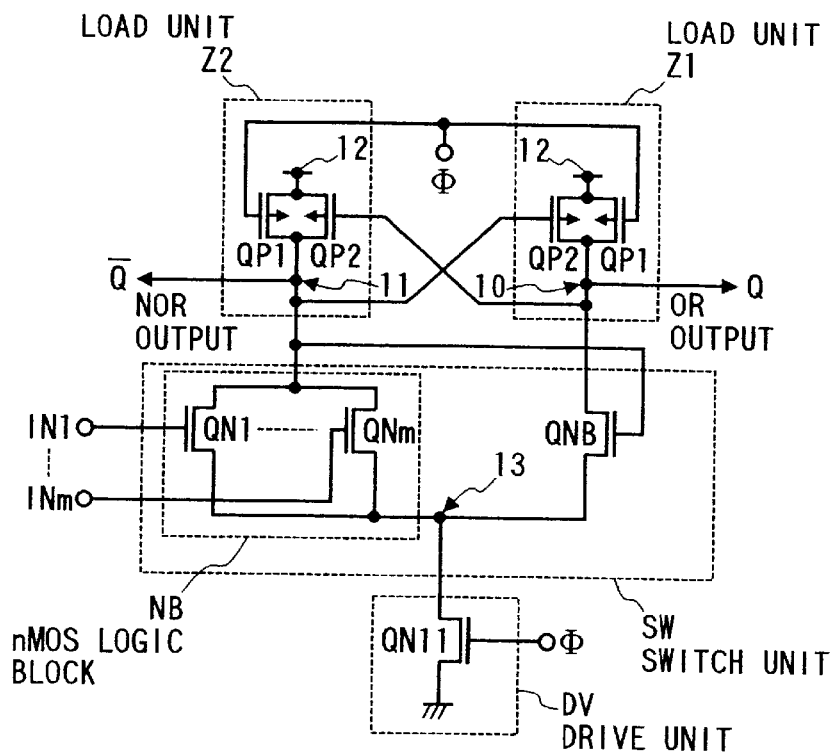
FIG. 5 shows a truth table in the second embodiment of the present invention.
FIG. 6 shows the third embodiment of the present invention.

Next, referring to the circuit diagram shown in FIG. 4A and the truth table shown in FIG. 5, the operation of the circuit will be described. As shown in FIG. 5, the phase in which the clock signal φ is at the L level is a precharge phase, and the phase in which it is at the H level is an evaluate phase. The case 1 is a case where one or more of the input signals IN1 to INm are at the L level in the evaluate phase, and the case 2 is a case where all input signals IN1 to INm are at the H level in the evaluate phase.

Figure 4B:
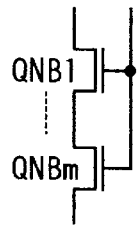
FIG. 4B shows a variation of a portion of a circuit shown in FIG. 4A.

First, in the precharge phase where the clock signal φ is at the L level, AND output Q and NAND output $\overline{Q}$ are both at the H level because of the same reason as in the first embodiment. That is, both outputs are at the H level, independent of the states of input signals IN1 to INm. Next, the case in which the level of the clock signal φ has proceeded from the L level to the H level and the state has proceeded to the evaluate phase will be described. At this time, in case one or more of input signals IN1 to INm are at the L level (in the case 1), AND output Q is at the L level and NAND output $\overline{Q}$ is at the H level. As the input transistor QN1 dose not become conductive and NAND output $\overline{Q}$ is still at the H level, if the input signal IN1, for example, is at the L level, a signal of the H level is applied to the gate of the reference nMOS transistor QNB. The reference nMOS transistor QNB becomes conductive, AND output Q is discharged and changed to the L level, NAND output $\overline{Q}$ is not discharged and is still at the H level. In the meantime, in case all input signals IN1 to INm are at the H level (in the case 2), at first the input transistors QN1 to QNm and the reference nMOS transistor QNB both become conductive. However, as NAND output $\overline{Q}$, that is, the gate potential of the reference nMOS transistor QNB is discharged, and rapidly changes to the L level because the input transistors QN1 to QNm become conductive and the reference nMOS transistor QNB rapidly becomes non-conductive. Therefore, AND output Q is not discharged and held at the H level. When plural input nMOS transistors QN1 to QNm connected in series are used as described above, it is desirable in view of the operation that the reference nMOS transistor QNB is also constituted by plural nMOS transistors QNB1 to QNBm connected in series as shown in FIG. 4B. It is because the threshold voltage of the MOS transistors on the input side and that of the reference side can be compensated.

If the above circuit is used for a decoder circuit, NAND output $\overline{Q}$ is selected as the output of the decoder circuit, and the case (case 2) in which all input signals IN1 to INm are at the H level and NAND outputs $\overline{Q}$ is at the L level is used as a selected state and the case (case 1) in which one or more of input signals IN1 to INm are at the L level and NAND output $\overline{Q}$ is at the H level is used as an unselected state. The present embodiment, as in the first embodiment, does not require complementary inputs and is free from the complexity and difficulty in use which result from the double rail logic.

Next, the third embodiment is shown in FIG. 6. will be described. This embodiment is different from the first embodiment shown in FIG. 1 in terms of the constitution of load units Z1 and Z2. In this embodiment, each load unit has a precharging pMOS transistor QP1 and a pull-up pMOS transistor QP2, and a source part at which the respective sources of the precharging pMOS transistor QP1 and the pull-up pMOS transistor QP2 are connected, and a drain part at which the respective drains of them are connected. Also, the gate of the pull-up pMOS transistor QP2 in the load unit Z1 is connected to the drain part of the other load unit Z2. In the meantime, the gate of the pull-up pMOS transistor QP2 in the load unit Z2 is cross-coupled to the drain part of the other load unit Z1. Also, the drain part of the load unit Z1 is connected to the drain of the reference nMOS transistor QNB and the drain part of the load unit Z2 is connected to the drain side output of the nMOS logic block NB. The drain part of the load unit Z2 is connected to the gate of the reference nMOS transistor QNB. The gate of the precharging pMOS transistor QP1 in each load unit Z1 or Z2 is driven by the clock signal $\phi$. That is, this embodiment is different from the first embodiment shown in FIG. 1 in that the pull-up pMOS transistors QP1 the respective gates of which are cross-coupled to the drain part of the other load unit are added to the load units.

The role of the pull-up pMOS transistor QP2 will be described below. As the basic operation of this embodiment is the same as that of the first embodiment shown in FIG. 1, the above role will be described by referring to the truth table shown in FIG. 2. As described above, in the case 1 shown in FIG. 2, OR output Q is at the L level and NOR output $\overline{Q}$ is at the H level. Also, in the case 2, OR output Q is at the H level and NOR output $\overline{Q}$ is at the L level. The resultant OR output and NOR output are the same in the first embodiment and in this embodiment. However, the H level in the case 1 and that in the case 2 is in a floating state in the first embodiment, while it is an advantage that the above high level is not in a floating state in this embodiment. That is, in this embodiment, for example, if OR output Q is at the L level, the pull-up pMOS transistor QP2 in the load unit Z2 becomes conductive, and NOR output $\overline{Q}$ is charged to the H level. In the meantime, if NOR output $\overline{Q}$ is at the L level, the pull-up pMOS transistor QP2 in the load unit Z1 becomes conductive, and OR output Q is charged to the H level. Therefore, a floating state can be prevented. As described above, the role of the pull-up pMOS transistor QP2 is to prevent the respective H levels in the evaluate phase of OR output Q and NOR output $\overline{Q}$ from floating.

Figure 7:
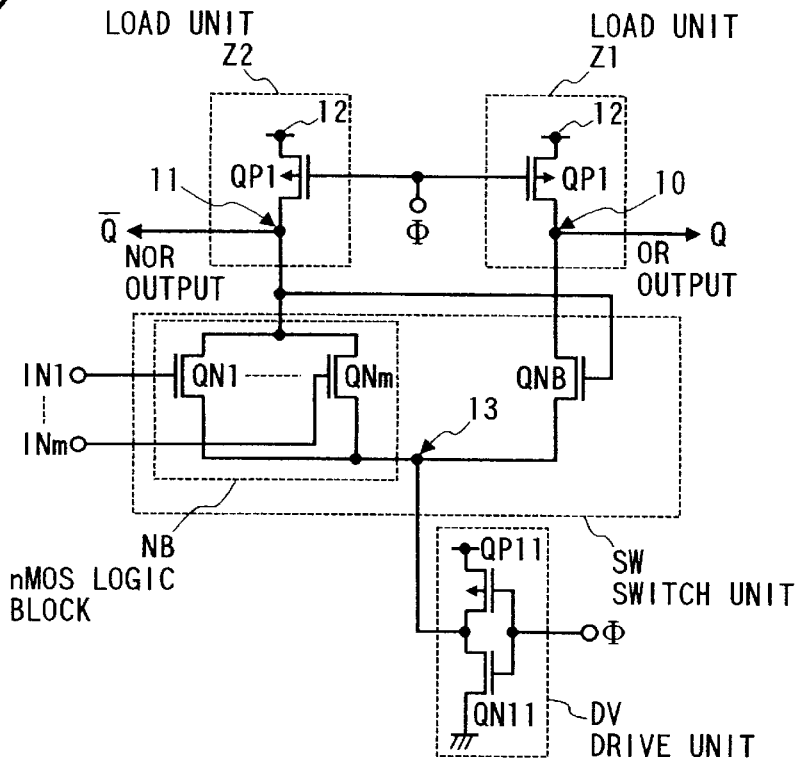
FIG. 7 shows the fourth embodiment of the present invention.

Next, the fourth embodiment shown in FIG. 7 will be described. This embodiment is different from the first embodiment shown in FIG. 1 in terms of the constitution of the drive unit DV. In this embodiment, the driving part DV is constituted by a CMOS inverter comprising an nMOS transistor QN11 and a pMOS transistor QP11. The output of the inverter is connected to a source-coupled part in the above switch unit SW, and the input of the inverter is driven by the clock signal $\phi$. That is, this embodiment is different from the first embodiment shown in FIG. 1 in that the pMOS transistor QP11 is added to the drive unit DV.

The role of the pMOS transistor QP11 will be described below. As the basic operation of this embodiment is the same as that of the first embodiment shown in FIG. 1, the above role will be described referring to the truth table shown in FIG. 2. As described above, in the case 1 in the evaluate phase shown in FIG. 2, OR output Q is at the L level, and NOR output $\overline{Q}$ is at the H level. Also, the source-coupled part at which the source side output of the nMOS logic block NB and the source of the reference nMOS transistor QNB are coupled is at the L level and the reference nMOS transistor QNB dose not become conductive. The behavior of OR output Q will be described below in comparison with the above behavior in the first embodiment, in case where the level of the clock signal $\phi$ has changed from the H level to the L level thereafter and the phase has proceeded to the precharge phase.

Both in the first embodiment and in this embodiment, as the state of the precharging pMOS transistor QP1 in the load unit Z1 changes from a non-conductive state to a conductive state, OR output Q starts to be charged and to proceed from the L level to the H level. At this time, in the first embodiment, the potential difference between the source and the drain of the reference nMOS transistor QNB is large and the gate potential is kept at the H level. So, the reference nMOS transistor QNB starts to become conductive. Therefore, the capacitive load of the source-coupled part starts to become influential, and OR output Q is prevented from rapidly proceeding from the L level to the H level. In the meantime, in this embodiment, when OR output Q starts to be charged and to proceed from the L level to the H level, the pMOS transistor QP11 in the drive unit DV becomes conductive simultaneously. So, the source-coupled part starts to be charged and to proceed from the L level to the H level. Therefore, the potential difference between the source and the drain of the reference nMOS transistor QNB does not increase, and the reference nMOS transistor QNB does not become conductive. So, the capacitive load of the source-coupled part does not become influential. Therefore, OR output Q can proceed from the L level to the H level more rapidly than in the first embodiment.

Figure 3:
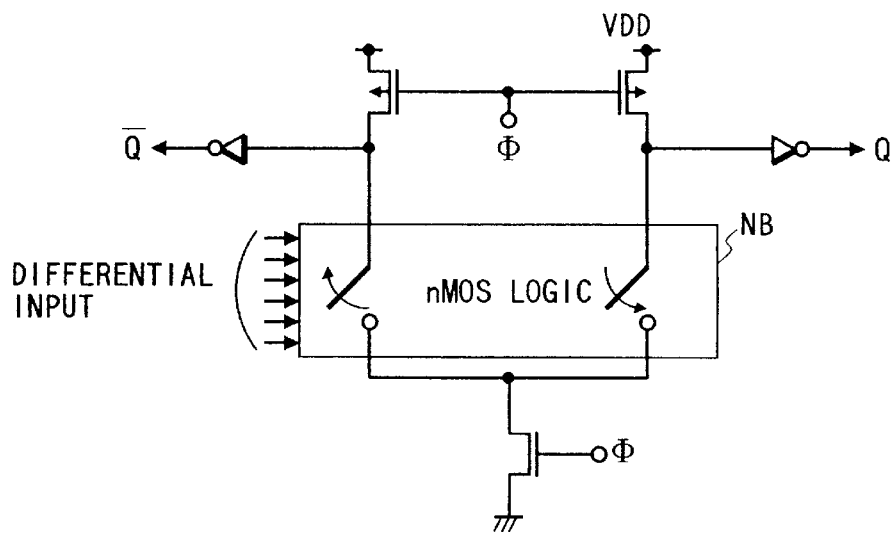
FIG. 3 is shows a prior example.
Figure 8:
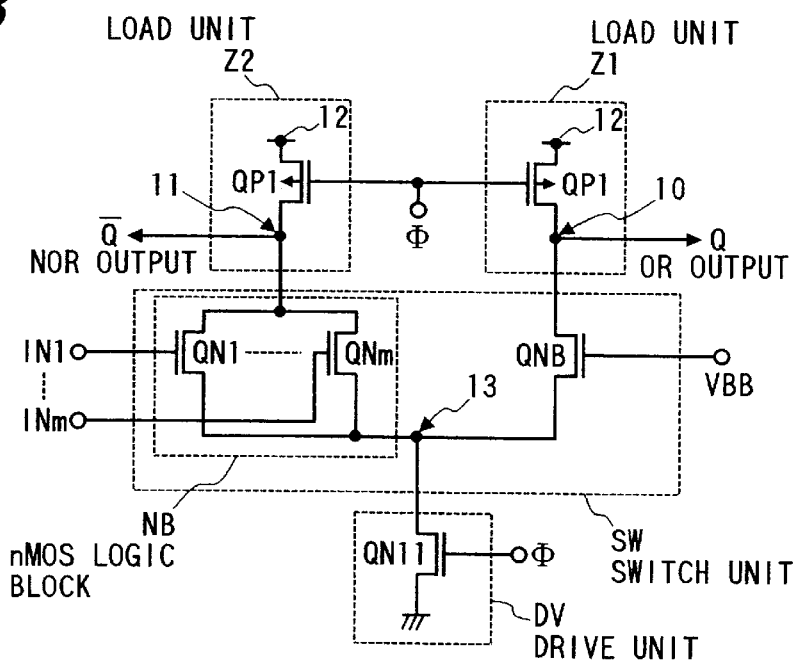
FIG. 8 shows the fifth embodiment of the present invention.

Next, the fifth embodiment shown in FIG. 8 will be described. This embodiment is different from the first embodiment shown in FIG. 1 in terms of a method of driving the gate of the reference nMOS transistor QNB. In this embodiment, the gate of the reference nMOS transistor QNB is driven by an arbitrary reference voltage VBB. The reference voltage VBB may be arbitrary voltage, however, it is desirable in view of a stable operation that the reference voltage is set to a middle value between the H level and the L level of the input signal. In this case, difference between the gate voltage of the reference nMOS transistor QNB and the L level of the input is {(H level/2)–L level}(if the L level is 0). Generally, difference between the gate voltage of the reference nMOS transistor QNB and the L level of the input signal is {(H level+L level)/2–L level}. In the meantime, in the first embodiment, the above difference is (H level–L level) and is larger than that in this embodiment. The present circuit can replace plural complementary inputs of the CVSL circuit shown in FIG. 3 by one input of VBB.

Figure 9:
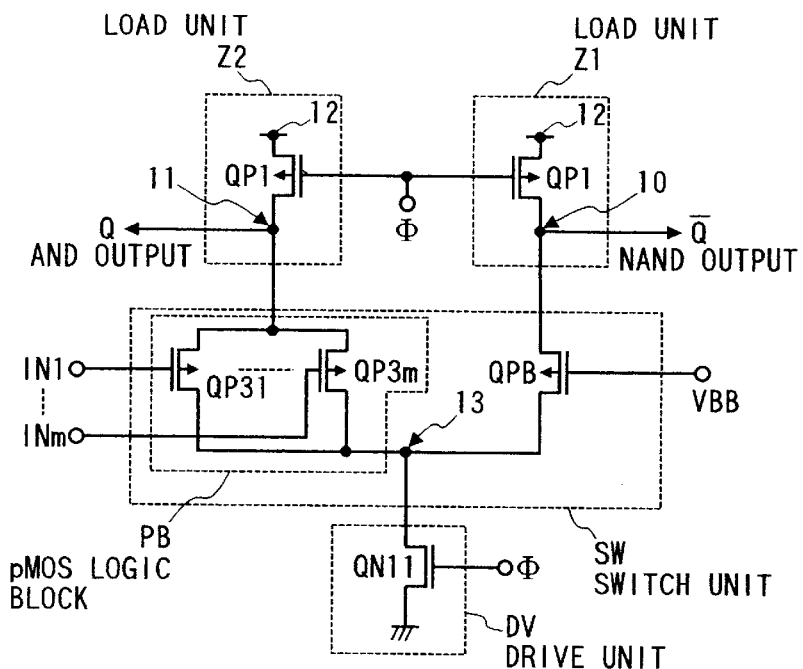
FIG. 9 shows the sixth embodiment of the present invention.

Next, the sixth embodiment shown in FIG. 9 will be described. This embodiment is different from the first embodiment shown in FIG. 1 in that the switch unit SW is constituted by the pMOS logical block PB and the reference pMOS transistor QPB, and in that the gate of the reference pMOS transistor QPB is driven by an arbitrary reference voltage VBB. This embodiment is similar to the second embodiment shown in FIG. 4 in terms of its logical operation, and the output Q is an AND output and the output $\overline{Q}$ is a NAND output. However, in the second embodiment, the number of input transistors connected in series is the same as the number of inputs, while in this embodiment, the number of input transistors connected in series is one, independent of the number of inputs. So, the operation is more rapid in this embodiment.

Figure 10:
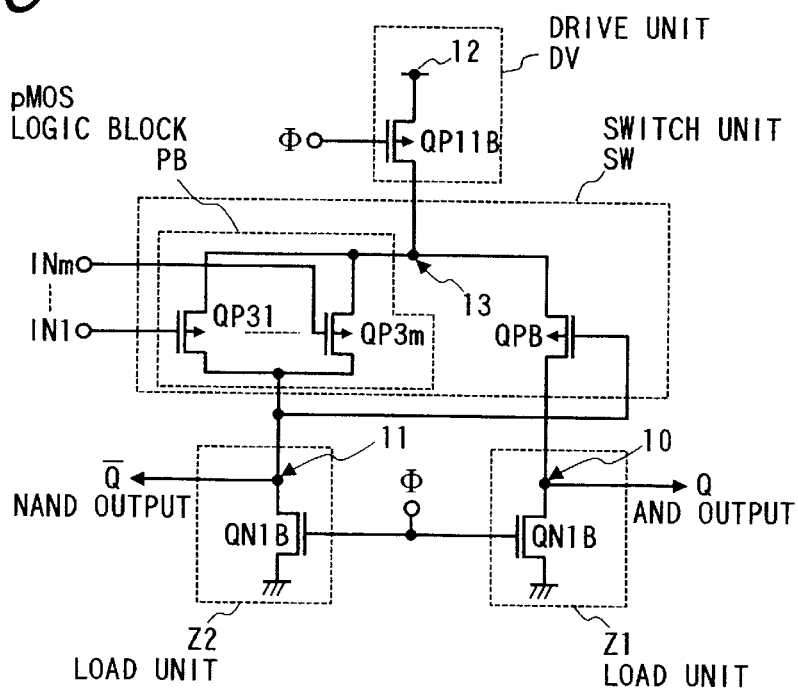
FIG. 10 shows the seventh embodiment of the present invention.
Figures 11, 12:
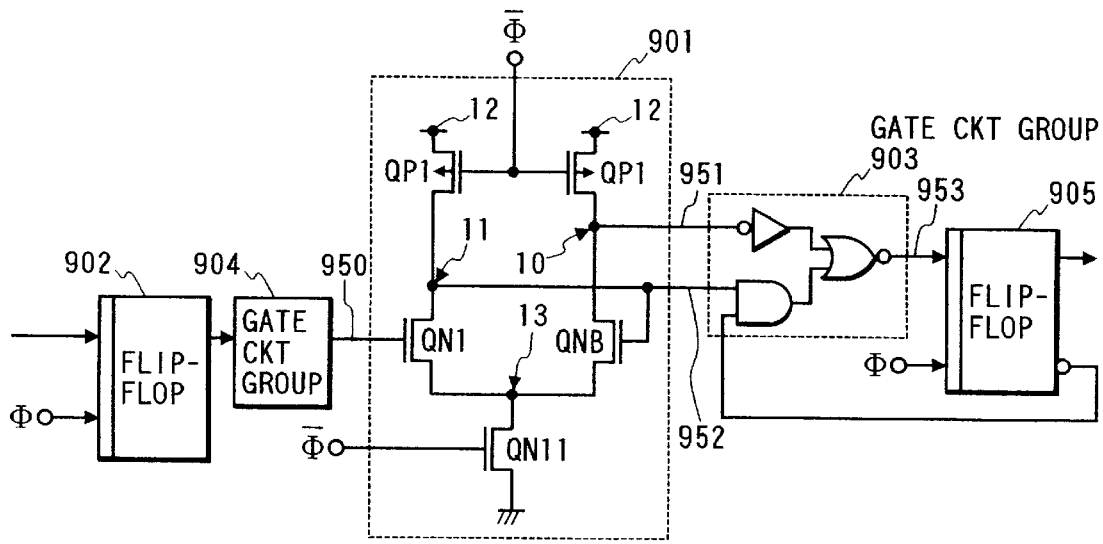
FIG. 11 shows a truth table in the seventh embodiment of the present invention.
FIG. 12 shows the eighth embodiment of the present invention.

In the above embodiments, the output level in the precharge phase is the H level. Next, an embodiment in which the output level in the precharge phase is the L level will be described. In such an embodiment, the nMOS transistors and pMOS transistors constituting the above switch unit SW, the drive unit DV and the load units Z1 and Z2 respectively shown in the above first to sixth embodiments are replaced respectively by pMOS transistors, and nMOS transistors, and the high potential side and the low potential side of the source voltages are exchanged. FIG. 10 shows an example in which the first embodiment has been reconstituted by the above method as the seventh embodiment. FIG. 11 shows the truth table about the embodiment shown in FIG. 10. As shown in FIGS. 10 and 11, output Q is an AND output and output $\overline{Q}$ is a NAND output. In this embodiment, the precharge phase is one in which the clock signal $\phi$ is at the H level, and both outputs are at the L level, independent of the respective states of input signals IN1 to INm, because nMOS transistors QNlB in load units Z1 and Z2 become conductive. Also, the evaluate phase is one in which the clock signal $\phi$ is at the L level, and in a case (case 1) where one or more of input signals IN1 to INm are at the L level, and output Q is at the L level and NAND output $\overline{Q}$ is at the H level. For example, if the input signal IN1 is at the L level, at first the input transistor QP31 and the reference pMOS transistor QPB are both become conductive. However, NAND output $\overline{Q}$, that is, the gate potential of the reference pMOS transistor QPB is charged, because the input transistor QP31 is conductive, and the gate potential rapidly reaches the H level, and the reference pMOS transistor QPB rapidly becomes non-conductive. So, AND output Q is not charged and held at the L level. In the meantime, in a case (case 2) where all input signals IN1 to INm are at the H level, the input transistors QP31 to QP3m are non-conductive, and the reference pMOS transistor QPB is conductive. So, AND output Q is charged to the H level, and NAND output $\overline{Q}$ is not charged and remains the L level.

If the circuit in this embodiment is used for a decoder circuit, AND output Q is selected as the output of the decoder circuit. The case (case 2) in which all input signals IN1 to INm are at the H level and AND output Q is at the H level is used as a selected state. The case (case 1) in which one or more of input signals IN1 to INm are at the L level and AND output Q is at the L level is used as an unselected state. An example has been described above, which is obtained by reconstituting an embodiment, for example, the first embodiment, in which an output level in the precharge phase is the L level. Other examples can be obtained from the second to sixth embodiments similarly though explanation about them is omitted.

Next, the eighth embodiment of the present invention shown in FIG. 12 will be described. This embodiment is a circuit for preventing a phenomenon (what is called racing) in which a signal which should exist is eliminated in a signal transmission circuit from a flip-flop to a flip-flop, because a signal to be taken in the next cycle arrives before the clock signal of the receiving side falls. As shown in FIG. 12, the reference number 901 denotes a clocked logic gate circuit according to the present invention, 902 denotes a flip-flop on the transmission side, 903 and 904 respectively denote a group of gate circuits and 905 denotes a flip-flop on the receiving side. The flip-flops 902 and 905 are flip-flops of so-called level sensing type and are constituted so that, when a clock signal $\phi$ is at a high level, they output a signal input as it is, and when the clock signal $\phi$ has become a low level, they hold the output signals immediately before. Therefore, if the propagation delay time of the group of gate circuits 904 is short, racing may be caused when the output 950 is directly connected to the input 953 of the flip-flop 905 on the receiving side. Heretofore, to prevent this phenomenon, it is general to constitute the flip-flop 905 on the receiving side, so that it takes in an input signal only in a moment at which the clock signal $\phi$ rises (so that the flip-flop is of a so-called master-slave type or an edge-triggered type), to insert a level sensing type flip-flop operated by a clock signal $\overline{\phi}$ with a reverse polarity to the clock signal $\phi$ between the output 950 and the input 953. However, these methods both increase quantity corresponding to the one level sensing type flip-flop (quantity of approximately ten MOS transistors). The eighth embodiment of the present invention is constituted so that the circuit 901 in any of the first to the seventh embodiments of the present invention is inserted between the output 950 and the input 953 as shown in FIG. 12, and the circuit is operated by the clock signal $\overline{\phi}$ with a reverse polarity to the clock signal $\phi$. In the circuit, the clock signal $\overline{\phi}$ with the reverse polarity to the clock signal $\phi$ is at a low level while the clock signal $\phi$ is at a high level (that is, while the flip-flop 905 may cause racing). So, lines 951 and 952 are both at a high level and the same signal as the output of the flip-flop 905 is inputted to the input 953. Therefore, racing is prevented. The number of MOS transistors in the circuit 901 shown in FIG. 12 is approximately five, and the volume of hardware can be reduced, compared with the number of MOS transistors in the conventional type flip-flop. The circuit in any of the first to seventh embodiments of the present invention can be used for the circuit 901. Therefore, part of the logical function of the group of gate circuits 904 can be shared by the circuit 901.

Figure 13:
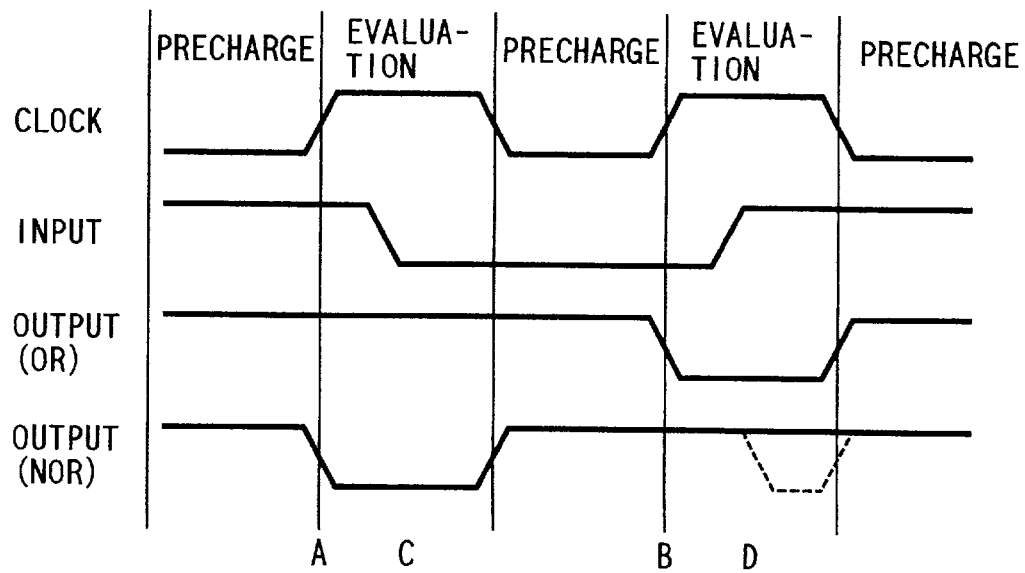
FIG. 13 is an explanatory drawing of an operation of the first embodiment of the present invention.

Next, the output operation in case a level of an input changes in the evaluate phase will be described using the first embodiment shown in FIG. 1 as an example. FIG. 13 is an explanatory drawing of the operation. When the level of the clock signal $\phi$ proceeds from the precharge level to the evaluate level (at a point A or B), the output level Q and $\overline{Q}$ becomes ones shown by the truth table shown in FIG. 2 according to the input level at that time, as described above. Afterward, in case the input level changes from the H level to the L level (at point C) in the evaluate phase, the output level does not change. It is because, if the input is at the H level when the evaluate phase starts, the level of the drain (NOR output) of the input transistor QN1, . . . or QNm changes to the L level. That is, it is because the input transistor QN1, . . . or QNm is not conductive and does not respond to the change of the input in this case. In the meantime, in case the input level changes from the L level to the H level (at point D) in the evaluate phase, the output level changes from the H level to the L level as shown by a broken line in FIG. 13. It is because, if the input is at the L level when the evaluate phase starts, the level of the drain (NOR output) of the input transistor QN1, . . . or QNm changes to the H level. That is, it is because the input transistor QN1, . . . or QNm becomes conductive and responds to the change of the input in this case.

Figure 14:
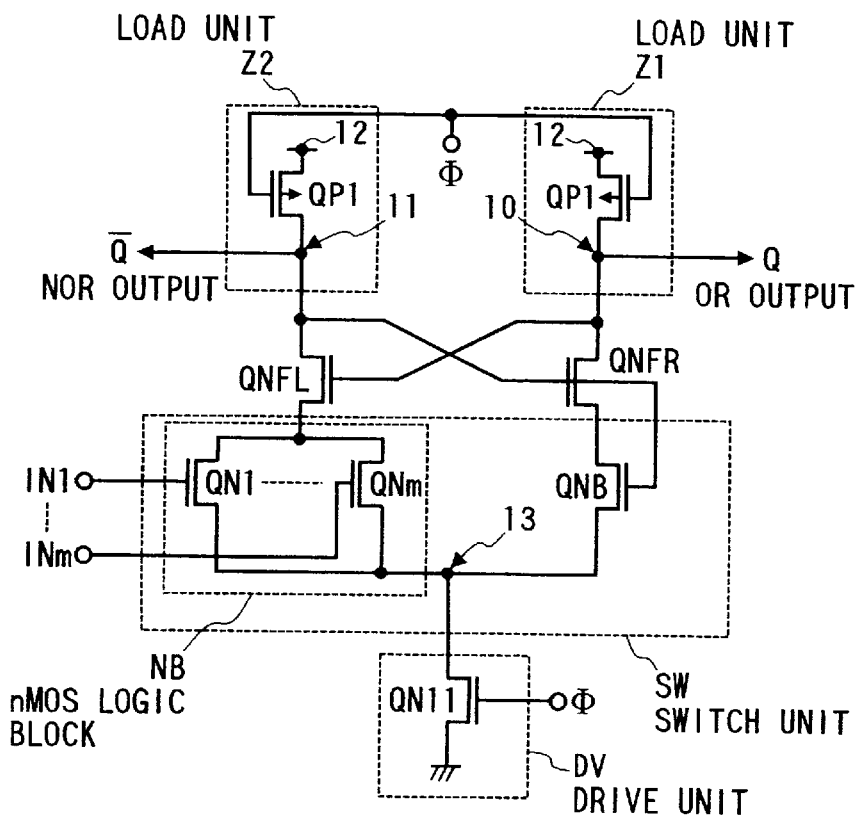
FIG. 14 shows the ninth embodiment of the present invention.

Next, an embodiment in which the output level does not change even if the input level changes in the evaluate phase will be described. FIG. 14 shows the ninth embodiment. This embodiment is constituted by providing feedback transistors QNFL and QNFR to the circuit in the first embodiment shown in FIG. 1. A load unit Z1 and the drain of the feedback transistor QNFR are connected (at OR output) and the source of the feedback transistor QNFR and the drain of the reference transistor QNB are connected. In the meantime, a load unit Z2 and the drain of the feedback transistor QNFL are connected (at NOR output) and the source of the feedback transistor QNFL and the drain of the nMOS logic block NB are connected. The OR output is connected to the gate of the feedback transistor QNFL and the other NOR output is connected to the gate of the feedback transistor QNFR and the fate of the reference transistor QNB. The remaining part has the same constitution as in the first embodiment. The operation in this embodiment will be described referring to the explanatory drawing of the operation shown in FIG. 13. In case the level of an input changes from the H level to the L level in the evaluate phase (at point C), the output level does not change. It is because, if the input is at the H level when the evaluate phase starts, the level of the OR output changes to the H level, so, the transistor QNFL which receives the OR output at the gate becomes conductive and the level of the drain of the input transistor QN1 . . . or QNm changes to the same L level as the level of the NOR output. That is, it is because the input transistor QN1 . . . or QNm is nonconductive and does not respond to the change of the input in this case. In the meantime, even in case the input level changes from the L level to the H level (at point D) in the evaluate phase, the output level does not change, as shown by a full line in FIG. 13. It is because, if the input is at the L level when the evaluate phase starts, the level of the output changes to the L level, so, the transistor QNFL which receives the OR output at the gate is non-conductive. That is, in this case, the NOR output does not respond to the change of the input, independent of whether or not the input transistor QN1, . . . or QNm is conductive.

A case in which the feedback transistors QNFL and QNFR are provided to the circuit in the first embodiment is described above, however, in the second to seventh embodiments, the same effect can be also obtained by providing the feedback transistors QNFL and QNFR as in the present embodiment. However, in the seventh embodiment, pMOS transistors are used for the feedback transistors.

The embodiments of the clocked logic gate circuit are described above. The same effect as in the above embodiments can be also obtained even if independent signals $\phi 1$ and $\phi 2$ are respectively inputted to the load unit and the drive unit in the above embodiments. The same effect can be also obtained if the load units and the drive unit are constituted by resistors and others.

Figure 15:
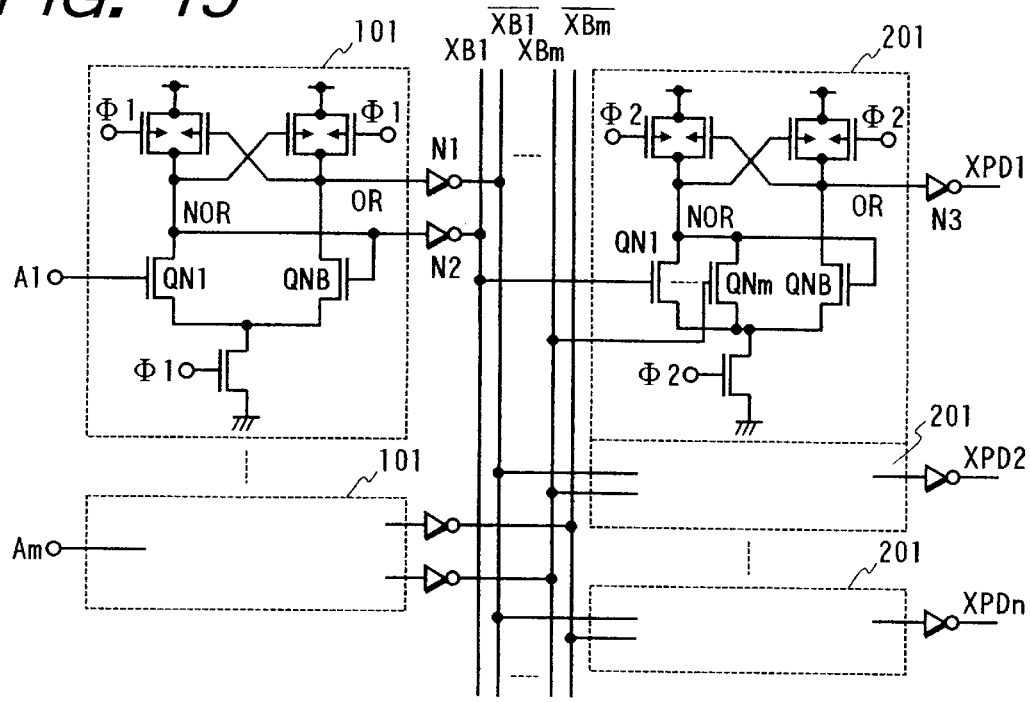
FIG. 15 shows the tenth embodiment of the present invention.

Next, the tenth embodiment shown in FIG. 15 will be described. In this embodiment, an example in which the clocked logic gate circuit is applied to a semiconductor memory or the address decoder circuit of a semiconductor integrated circuit will be described. As shown in FIG. 15, the reference number 101 denotes an address buffer, 201 denotes a decoder. Both are circuits according to the present invention. N1 to N3 denote inverts, A1 and Am denote address inputs, XB1 to $\overline{XBm}$ denote buffer output lines and XPD1 to XPDn denote decoder output lines. The address buffer 101 is driven by a clock signal $\phi 1$ and the decoder 201 is driven by a clock signal $\phi 2$. When clock signals $\phi 1$ and $\phi 2$ are at the L level (in the precharge phase), the outputs (OR and NOR outputs) of all address buffers and all decoders are charged to the H level. Therefore, the levels of the output lines XB1 to $\overline{XBm}$ of all the buffers and the output lines XPD1 and XPDn of all the decoders change to the L level via the inverters N1 to N3. In the meantime, when clock signals $\phi 1$ and $\phi 2$ are at the H level (in the evaluate phase), the address buffers and the decoders are activated, and the level of the buffer output lines XB1 to $\overline{XBm}$ change to the H level or to the L level, according to the potential levels of the address inputs. OR output of one decoder to which only the data of the buffer output line which is at the L level is inputted changes to the L level, and the level of one decoder output line changes to the H level via the inverter. To prevent malfunction, the timing for inputting the clock signal $\phi 2$ is required to be one in which the level of the buffer output line changes from the L level to the H level after a signal is transmitted to the buffer output line. According to this embodiment, a high-speed operation is enabled, because the OR and NOR outputs based upon address inputs can be obtained in phase by the address buffers 101, and the number of nMOS transistors connected in series in the decoder 201 is two even if the number of the inputs are large. Also, the cycle time can be reduced by using clock signals $\phi 1$ and $\phi 2$ respectively set so that the phase in which the pulse length is short is used at the evaluate phase and the phase in which the pulse length is long is used as the precharge phase. It is because the pulse length of the signal outputs from the address buffers and the decoder circuits can be reduced. Hereby, a high-speed address decoder circuit can be obtained. In this embodiment, an example in which both the address buffer and the decoder are the clocked logic gate circuit according to the present invention is described. However, one of them may be also constituted by the clocked logic gate circuit according to the present invention and the other may be also constituted by (a) a generally used dynamic CMOS logic circuit, or (b) a CMOS and BiCMOS OR, AND or NOT circuit. However, the operation of the former is more rapid.

In the meantime, if clock signals $\phi 1$ and $\phi 2$ are used for the buffer and the decoder as described above even if the buffer and the decoder are constituted by a generally used dynamic CMOS logic circuit, or a CMOS or BiCMOS OR, AND or NOT circuit, the cycle time can be reduced as described above. However, the former is more rapid.

Figure 16:
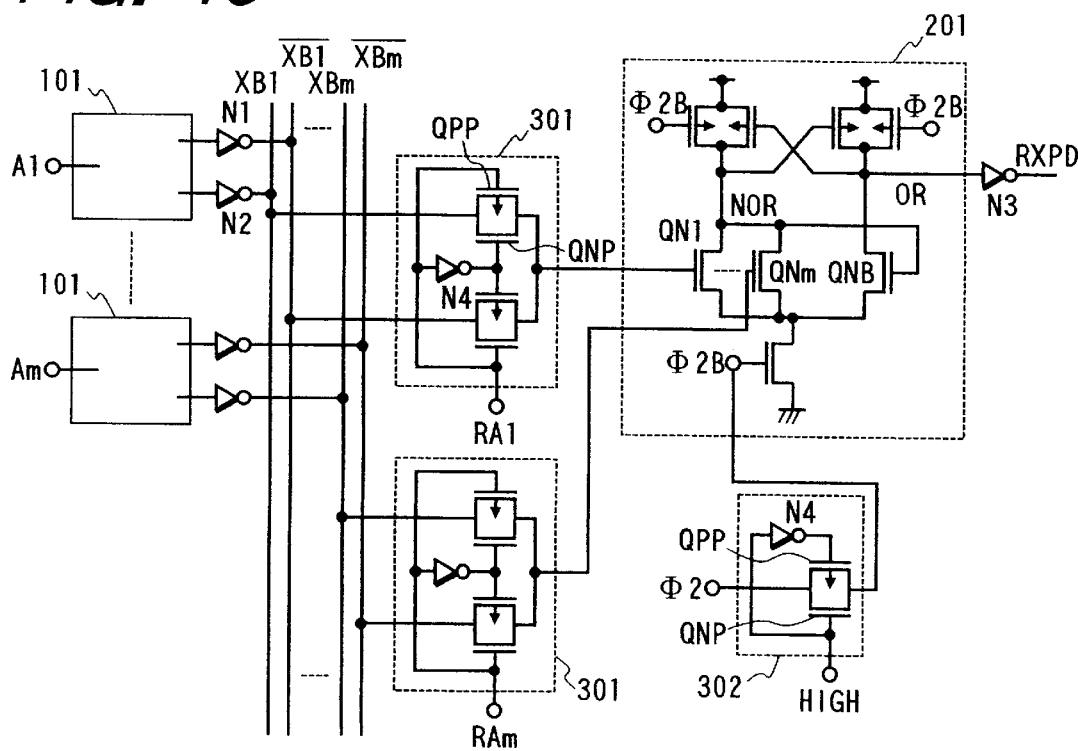
FIG. 16 shows the eleventh embodiment of the present invention.

Next, the eleventh embodiment shown in FIG. 16 will be described. In this embodiment, an example in which the present invention is applied to a redundancy address decoder circuit for selecting a redundancy word lien or a redundancy bit line will be described. The above circuit is constituted by adding the path transistor circuits 301 and the path transistor circuit 302 to the constitution of the tenth embodiment shown in FIG. 15. The path transistor circuit 301 is constituted by two pairs of path transistor circuits consisting of a pMOS transistor QPP and an nMOS transistor QPN respectively driven by an inverter N4, and is a circuit for transmitting a signal on the buffer output line to the input of the decoder. For example, a redundancy address signal RA1 controls which of the signals on the address buffer output lines XB1 and $\overline{XBm}$ is to be transmitted to the decoder. The relationship between other address signal Am and a redundancy signal RAm is also the same. Therefore, when address signals A1 and Am are addresses to be relieved, redundancy address signals RA1 and RAm are set so that the L level is transmitted to the outputs of all path transistor circuits. In this case, the redundancy decoder 201 is selected and the redundancy decoder line RXPD changes to the H level. At this time, it is clear that the input timing of the redundancy decoder is delayed by the delay time of the path transistor circuit 301, compared with the tenth embodiment, and a timing margin between the input and the clock signal φ2 is decreased. Therefore, the clock signal φ2 activates the redundancy decoder by way of the path transistor circuit 302 comprised of a pair of path transistors, as the clock signal φ2B. If the path transistor circuit 302 is the dummy circuit of the path transistor circuit 301, a timing margin between the input to the redundancy decoder and the clock signal φ2B is the same as in the tenth embodiment, and the operation is stabilized. As described above, in this embodiment, a high-speed address decoder circuit can be also obtained as in the tenth embodiment.

Figure 17:
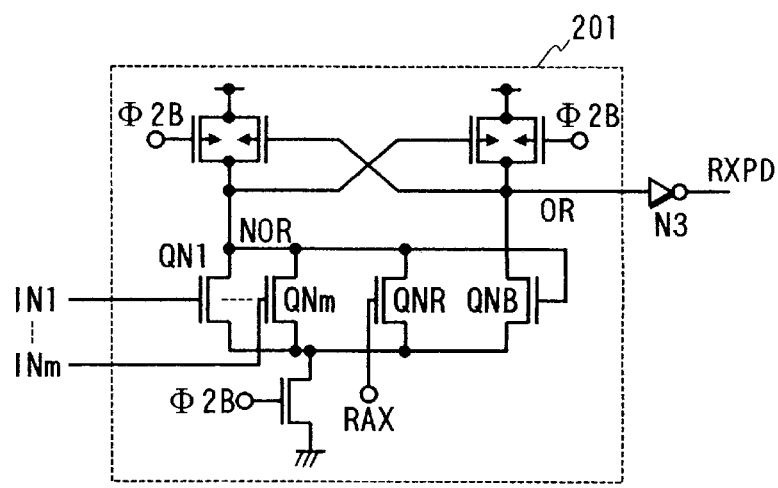
FIG. 17 shows the twelfth embodiment of the present invention.

Next, the twelfth embodiment shown in FIG. 17 of the present invention will be described. This embodiment has a function of whether to be relieved or not added to the above redundancy decoder 201. This embodiment has a constitution that an nMOS transistor QNR is connected to the redundancy decoder 201 shown in FIG. 16 in parallel to input transistors QN1 to QNm. In executing relief, the gate potential RAX of the transistor QNR is controlled to the L level. At this time, if inputs IN1 to INm is an address to be relieved, the level of the redundancy decoder line RXPD is changed to the H level for selection, and if they are not addresses to be relieved, the decoder line is at the L level for non-selection. In the meantime, if the addresses are not to be relieved, the gate potential RAX of the transistor QNR is controlled to the H level. At this time, the redundancy decoder line RXPD is always at the L level for non-selection, independent of inputs IN1 to INm. As a result, the next circuit can be prevented from being operated unnecessarily and power consumption is reduced.

Figure 18:
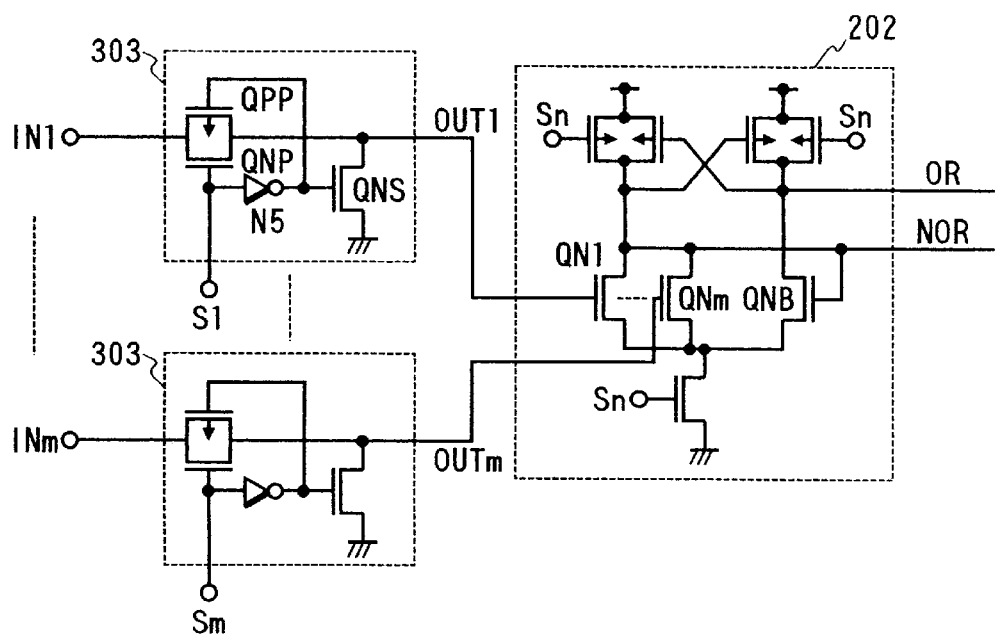
FIG. 18 shows the thirteenth embodiment of the present invention.

Next, the thirteenth embodiment shown in FIG. 18 of the present invention will be described. This embodiment shows a selector circuit for taking one signal among plural input signals. The reference number 202 denotes a logic circuit according to the present invention, and 303 denotes a path transistor circuit comprising path transistors QPP and QNP, an inverter N5 and a transistor QNS for preventing floating. S1 denotes a selection signal. In this embodiment, plural path transistor circuits are provided, and each output is connected to an input of a logic circuit 202 according to the present invention. The operation of the path transistor circuit will be described below. If a selection signal S1 is at the L level, the path transistors QPP and QNP are not conductive. So, an input signal IN1 is not transmitted to output OUT1. Further, as the gate of the transistor QNS for preventing floating is driven to the H level via the inverter N5, the above transistor becomes conductive and the output OUT1 is kept at the L level. In the meantime, if the selection signal S1 is at the H level, the gate of the transistor QNS for preventing floating is driven to the L level via the inverter N5. So, the above transistor does not become conductive. Furthermore, as the path transistors QPP and QNP become conductive, the input signal IN1 is transmitted to the output OUT1. Therefore, if only a selection signal, for example, S1 is at the H level and the other selection signals are all at the L level among the selection signals S1 to Sm, an output corresponding to the output OUT1 of the path transistor circuit obtained by the selection signal S1 is obtained for the output (OR and NOR) of the logic circuit 202. A signal Sn for activating the logic circuit 202 may be either of a clock signal inputted every cycle or a selection signal inputted only during the activation phase. Also, the logic circuit 202 may be also a general logic circuit, an AND circuit or a sensing circuit. However, as described above, as the number of nMOS transistors connected in series is two in the logic circuit 202 even if the number of the inputs are large, a high-speed selector circuit can be obtained.

According to all the embodiments described above, no complementary input is required by combining the switch unit SW, the loads unit Z1 and Z2 and the drive unit DV in the first to seventh embodiments shown in FIG. 1 and FIGS. 4 to 10, complication and difficulty in using which result from double rail logic are removed and as the number of MOS transistors connected in series is two consisting of a driving MOS transistor and an input transistor (or two consisting of a driving MOS transistor and a reference MOS transistor) independent of the number of inputs, basically a higher-speed clocked logic gate circuit can be obtained than a CMOS logic circuit and a path transistor logic circuit the number of inputs of which is two or more and the number of transistors connected in series of which is two or more for example.

Figure 19A:
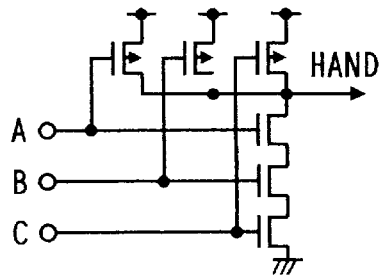
FIG. 19A shows a conventional logic circuit using static CMOS's.
Figure 19B:
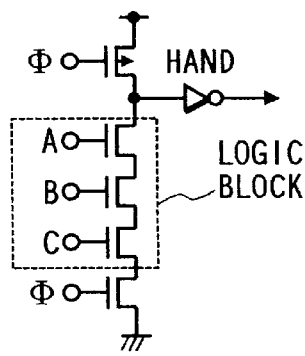
FIG. 19B shows a conventional logic circuit using dynamic CMOS's.
Figure 19C:
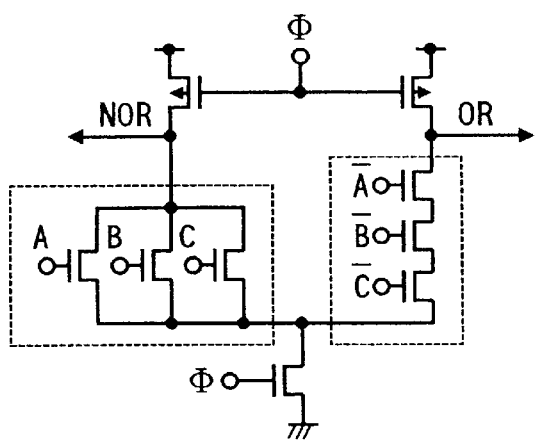
FIG. 19C shows a conventional logic circuit using dynamic CVSL's.
Figure 19D:
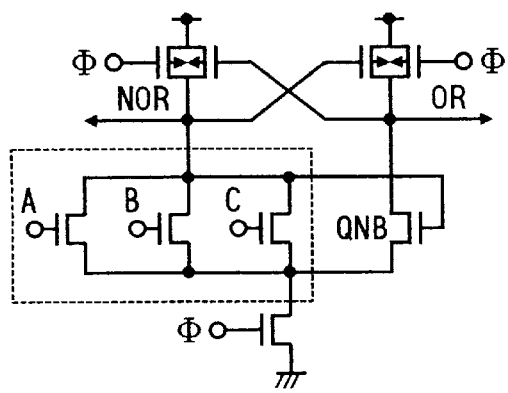
FIG. 19D shows a logic circuit using the present invention.

FIG. 19A (prior art), FIG. 19B (prior art), FIG. 19C (prior art) and FIG. 19D (present invention) are provided for comparing the logic circuits according to the prior art and that of the present invention. As shown in FIG. 20, in the constitution of the circuit according to the present invention shown in FIG. 19D, as the number of nMOS transistors connected in series is two, hereby, input capacity can be reduced, both polarities can be obtained for output polarity, and complementary inputs are not required, the high-speed operation is enabled, and it may safely be said that the clocked logic gate circuit according to the present invention is a facilitated logic circuit.

All the embodiments described above use MOS's, Field effect transistors of other structure (such as Shottkey type or junction type) can be used instead. In case Mos's are used, the DC component of the gate input can be removed by their gate insulating layers.

We claim:

1. A logic gate circuit, comprising:
   a first load provided between one electric potential and a first node, which charges said first node, in response to a control signal;
   a second load provided between said one electric potential and a second node, which charges said second node, in response to said control signal;
   a logic circuit provided between said first node and a third node, which electrically connects said first node and the third node, in response to plural input signals;
   a reference field effect transistor having a source-drain path formed between said second node and said third node, and a gate of which is connected to said first node; and a drive circuit provided between said third node and another electric potential, which drives said logic circuit and said reference field effect transistor, in response to said control signal, wherein said drive circuit comprises an inverter circuit having an output connected to said third node.

2. A logic gate circuit according to claim 1, wherein said first load comprises:

a first precharge field effect transistor having a source-drain path provided between said one electric potential and said first node, and having a gate to which said control signal is inputted; and a first pull-up field effect transistor having a source-drain path provided between said one electric potential and said first node, and having a gate which is connected to said second node;

wherein said second load comprises:

a second precharge field effect transistor having a source-drain path provided between said one electric potential and said second node, and having a gate to which said control signal is inputted; and a second pull-up field effect transistor having a source-drain path provided between said one electric potential and said second node, and having a gate which is connected to said first node.

3. A logic gate circuit according to claim 1, wherein said reference field effect transistor comprises a field effect transistor of MOS structure.

4. A logic gate circuit according to claim 1, wherein said input signal includes a first input signal and a second input signal;

wherein said logic circuit comprises:

a first field effect transistor having a gate to which said first input signal is inputted, and a second field effect transistor having a gate to which said second input signal is inputted, a drain which is connected to a drain of said first field effect transistor and a source which is connected to a source of said first field effect transistor.

5. A logic gate circuit according to claim 1, wherein said inverter circuit is comprised of a CMOS inverter.

6. A logic gate circuit according to claim 2, wherein said inverter circuit is comprised of a CMOS inverter.

7. A logic gate circuit according to claim 3, wherein said inverter circuit is comprised of a CMOS inverter.

8. A logic gate circuit according to claim 4, wherein said inverter circuit is comprised of a CMOS inverter.

* * * * *